April 23, 1968 C. B. LESLIE 3,379,986
DIRECT COUPLED TRANSISTORIZED CLASS "B" POWER AMPLIFIER
Filed Oct. 30, 1964
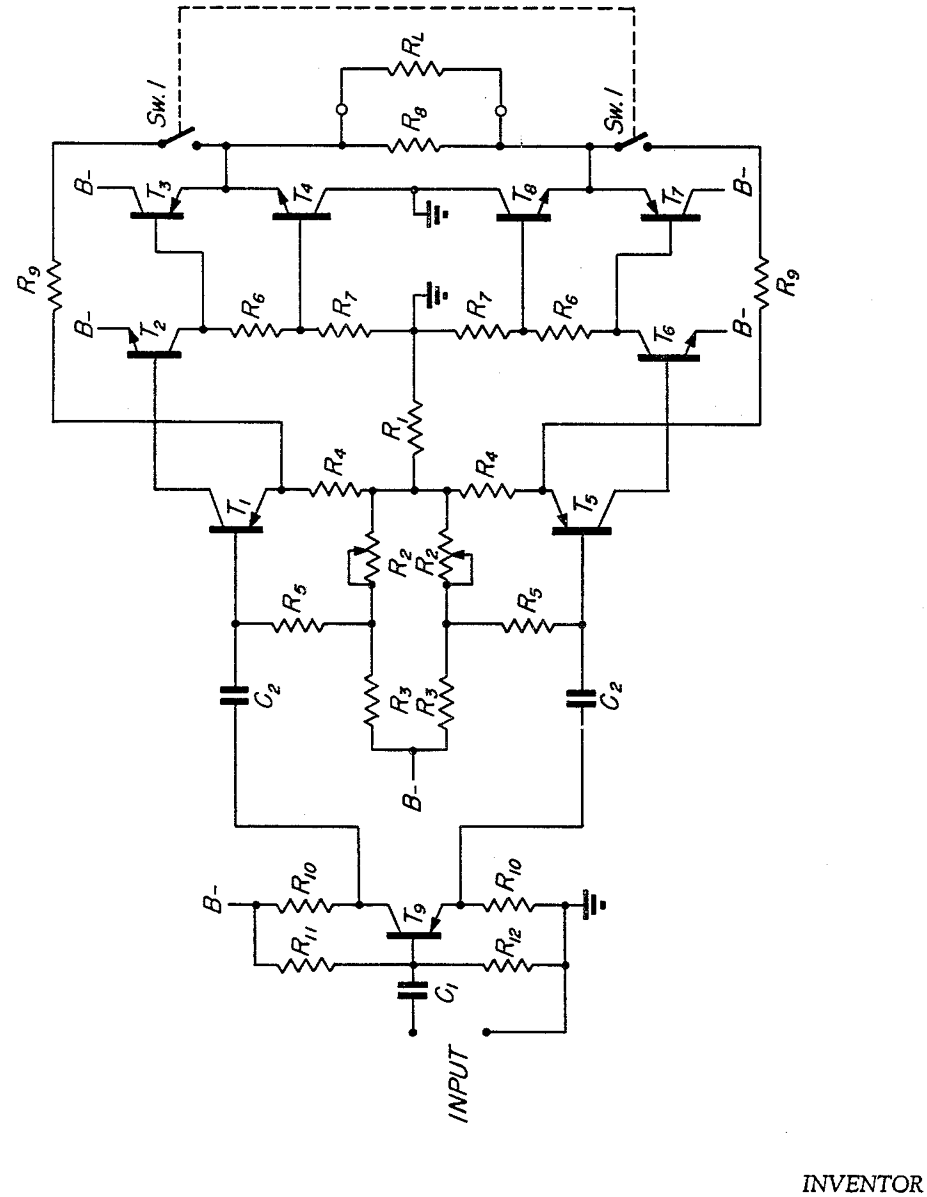
INVENTOR
Charles B. Leslie
BY
[signature]
ATTORNEY United States Patent Office 3,379,986

Patented Apr. 23, 1968

3,379,986

DIRECT COUPLED TRANSISTORIZED CLASS "B" POWER AMPLIFIER

Charles B. Leslie, 1106 Brantford Ave., Silver Spring, Md. 20904

Filed Oct. 30, 1964, Ser. No. 407,939
9 Claims. (Cl. 330—15)

ABSTRACT OF THE DISCLOSURE

An input push-pull driver stage receives an audio signal to be amplified and is connected to an intermediate current amplifier stage. The latter stage is connected to a full-wave transistor bridge output stage which directly drives a load without transformers or coupling capacitors. To reduce distortion the output stage is biased to provide slight conduction in the absence of a signal and negative feedback further reduces distortion.

The invention described herein may be manufactured and used by or for the Government of the United States of America for governmental purposes without the payment of any royalties thereon or therefor.

The present invention relates generally to power amplifiers and more particularly to a direct coupled transistorized class B inherently balanced power amplifier having a high efficiency and low distortion.

Standard circuits for transistorized power amplifiers normally utilize either transformers, coupling capacitors, or both, to provide a high power drive for a loud speaker or other desired load. To secure a good low frequency response, an output transformer must be extremely large, heavy and expensive. Even with these characteristics met, the amplifier will not drive down to D.C., and any transformers used will inherently introduce some distortion in the output signal. The use of transformers in the driver stage of the amplifier circuit produces essentially the same problems as described above with regard to the output transformers, except that smaller transformers can be used in the driver stages.

The use of large coupling capacitors in the output or driver stages of the amplifier results in disadvantages of size, low frequency response, and cost similar to those described above. For the low impedance loads usually used, the capacitors must be very large. If electrolytic condensers are used, reliability problems arise. Additionally, the use of transformers and condensers limit the amount of feedback which can be used without oscillation because of the phase shift introduced by the condensers or transformers.

Although transformerless power amplifiers have been designed to overcome the problems cited, these amplifiers have either been complex in circuit design, requiring numerous transistors, or not of an inherently balanced type capable of operating at a high efficiency and producing low distortion in the output signal.

Accordingly, an object of the present invention is to provide a simple, inherently balanced, power amplifier circuit which does not employ transformers or large coupling condensers to couple the circuit to the load or to any point within the feedback loop of the amplifier circuit.

Another object is to provide a new and improved power amplifier circuit, the design of which eliminates the necessity of using multiple power supplies.

A further object of the invention is to provide an amplifier circuit of the type described which operates at high efficiency and which introduces low distortion into the signal which is amplified.

Other and further objects of the invention will become more readily apparent in the following description of the sole embodiment thereof illustrated in the drawing to which reference is now made.

The input transistor $T_9$ which is connected to receive an input signal via capacitor $C_1$ at the base electrode thereof is shown as a convenient means of generating two equal out-of-phase inputs for the power amplifier circuitry to be described. The out-of-phase inputs are applied through capacitors $C_2$ to the initial driver stage including PNP transistors $T_1$ and $T_5$. If these two equal out-of-phase inputs are available from some other source they could be fed directly in at the two condensers $C_2$.

If the resistors $R_2$ are ignored temporarily, then resistor $R_1$ and the two parallel connected resistors $R_3$ form a voltage divider in the emitter-base circuits of the two transistors $T_1$ and $T_5$ which is arranged to develop a potential at the junction between resistors $R_4$ substantially half way between ground and B-volts. The small variable resistors $R_2$ are inserted in this voltage divider to give a small differential control on the voltage between the two symmetrical halves of the circuit. The small bias voltages generated by $R_2$, in conjunction with the resistors $R_5$, control the steady state collector currents through $T_1$ and $T_5$. The two identical resistors $R_4$ serve two functions They introduce degenerative stabilization for the transistor stages $T_1$ and $T_5$ and they form part of the overall feedback divider circuit which includes feedback resistors $R_9$.

The collector currents of $T_1$ and $T_5$ are amplified in the intermediate symmetrical stage of the amplifier circuit including transistors $T_2$ and $T_6$. These collector currents are applied to the base electrodes of the NPN transistors $T_2$ and $T_6$ and, after amplification by the current gains of these transistors, are coupled from the $T_2$ and $T_6$ collector electrodes to the full wave transistor bridge circuit to be described hereinafter. The bias voltages developed across resistors $R_2$ are adjusted in order to make the D.C. collector voltages of transistors $T_2$ and $T_6$ both equal to approximately half the B supply voltage.

The collectors of transistors $T_2$ and $T_6$ are each connected via the series connected resistors $R_6$ and $R_7$ to a point of reference potential. Resistor $R_6$ is small compared to resistor $R_7$; this enables a small bias voltage to be developed across $R_6$ which is just sufficient to bias the output transistors $T_3$, $T_4$, $T_7$ and $T_8$ into slight conduction with no input signal applied. This bias connection minimizes Cross-over distortion in the output upon the application of an input signal. For example, if the base-emitter voltage of transistor $T_3$ is 0.1 volt, then resistor $R_6$ will have approximately 0.2 volt developed across it. This adjustment is not critical, and does not substantially affect the output wave form. It does however affect the efficiency of the class B amplifier insofar as resistive power losses in the circuit are concerned.

With the amplifier operating push-pull, the collector voltage of $T_2$ goes negative relative to its operating point while the collector voltage of $T_6$ goes positive. During this half cycle, transistors $T_3$ and $T_8$ are conducting heavily, so that the current path is from ground to $T_8$, through the load $R_L$, and then through transistor $T_3$ to the supply voltage B−. During the next half cycle, the collector transistor $T_2$ goes positive relative to its operating point, and the collector of $T_6$ goes negative. During this half cycle the current path is from ground through $T_4$, through the load resistor opposite to the direction of current flow during the first half cycle, and then through $T_7$ to B−. In each case, the bias developed across $R_6$ is sufficient to cut off conduction through the pair of transistors which is not carrying the main current. An important feature of this circuit is that all four output transistors operate as emitter followers in a similar manner.

The four output transistors $T_3$, $T_4$, $T_7$ and $T_8$ form a full wave bridge type of output. The load $R_L$ is driven symmetrically about a D.C. value which is approximately half of the B— supply voltage. In other words, if the load were center tapped the center tap would remain at all times at this voltage. The full wave bridge circuit permits developing approximately the full B supply voltage (ground to B—) across the load during one half of the cycle and the negative of this (B— to ground) during the other half cycle. Thus, the total peak-to-peak voltage across the load resistor over a full cycle is approximately twice the B voltage. The use of a full wave transistor bridge circuit per se is well known, but its particular arrangement with the associated dirving circuitry illustrated in the drawing is deemed to be unique.

Negative feedback is provided by resistors $R_9$ connected between the outputs at the emitter junctions of $T_3$, $T_4$ and $T_7$ and $T_8$, respectively, and the emitters of the transistors $T_1$ and $T_5$ in the initial transistor driver stage. This negative feedback serves to stabilize the D.C. drift of the transistors $T_1$ and $T_5$ as well as to improve the wave form of, and decrease distortion to, amplified A.C. signals. The circuit permits an extremely simple but effective feedback system. The particular values shown in the table below for the feedback resistors and other associated circuit parameters provided 20 *db* of negative feedback, but there is no such limit inherently imposed on the amplifier circuit.

TABLE I

| Circuit parameter: | Value or type |
|---|---|
| $R_1$ | 1 KΩ |
| $R_2$ | 100Ω |
| $R_3$ | 2.2 KΩ |
| $R_4$ | 470Ω |
| $R_5$ | 15 KΩ |
| $R_6$ | 15Ω |
| $R_7$ | 680Ω |
| $R_8$ | 1 KΩ |
| $R_9$ | 2.7 KΩ |
| $R_{10}$ | 1 KΩ |
| $R_{11}$ | 33 KΩ |
| $R_{12}$ | 10 KΩ |
| $R_L$ | 45Ω |
| $C_1$ | 0.47 $\mu$fd. |
| $C_2$ | 0.47 $\mu$fd. |
| $T_1$, $T_5$ | 2N1415 |
| $T_2$, $T_6$ | 2N1304 |
| $T_3$, $T_7$ | 2N652 |
| $T_4$, $T_8$ | 2N1308 |
| $T_9$ | 2N1415 |

Switch 1 is shown only for convenience in adjusting and balancing the circuit but it is not essential for its operation. The balancing operation is best carried out by opening the switch as shown, and adjusting resistors $R_2$ so that each side of the load is at half the B supply voltage with no input signal. Then switch 1 should be closed and the voltage from load to ground observed. Normally there will be a few tenths of a volt differential in the voltage from load to ground in the open and closed (with feedback) positions of switch 1 respectively since the emitter voltages of transistors $T_1$ and $T_5$ may not be exactly one-half of the B supply voltage. Next the switch 1 should be opened again and resistors $R_2$ adjusted so that the D.C. voltages observed from load to ground are nearly equal to those observed with the switch 1 closed. When the switch 1 is again closed the circuit is ready for operation.

The frequency response from the bases of $T_1$ and $T_5$ to the load $R_L$ is flat down to D.C. and up to a high frequency limit imposed only by the transistor characteristics and stray capacitances in the circuit.

The circuit described above gives a stable, linear, high power output without use of transformers at any point in the circuit, without condensers in the output or driver stages or without multiple power supplies. The circuit operates at an extremely high efficiency and utilizes a naturally balanced bridge type output which permits substantially twice the power supply voltage to be developed across the load $R_L$. Negative feedback (including D.C.) is easily applied in any reasonable amount. The particular arrangement of the PNP and NPN transistors together with their associated resistors is responsible for the unique circuit characteristics.

It should be noted that many alternative arrangements and modifications in the circuit described above may be made without departing from the spirit and scope of the present invention. For example, the circuit could operate with the same general transistor configuration, but a positive rather than a negative power supply could be used simply by using PNP transistors where NPN transistors are specified in the drawing and vice versa.

A solid state junction diode inserted in its conducting direction with respect to its associated transistor and power supply, could be substituted for resistor $R_6$ to develop the bias necessary to just make the output transistors conduct. In fact, if it is desired to operate the power amplifier circuit over a wide range of B— supply voltages, this substitution would provide an advantage in that the voltage drop across the diode in the forward direction is substantially constant whereas the voltage drop across a resistor varies directly with the current therethrough, and in this application with the value of the B— supply.

Degenerative resistors may be inserted in the emitter of $T_2$ and $T_6$ if desired. This will decrease the gain of the transistors $T_2$ and $T_6$ somewhat but will improve the stability of these transistors with changes in temperature. Extra transistors may be inserted between the driver stages and the output stage so as to turn the output transistors into what is commonly known as the "Darlington" connection. This will increase the current gain in the output stages and permit more power output with the same driver stages, or the use of lower power driver stages to obtain the same power output.

Innumerable changes may be made in the absolute values of the circuit parameters listed in the table above without changing the basic operation or design of the circuit.

Accordingly, it should be understood that the scope of the present invention is limited only by the following appended claims.

I claim:

1. A direct coupled inherently balanced power amplifier circuit adapted to amplify a pair of push-pull input signals, said amplifier circuit comprising an input push-pull driver stage including a pair of valves having their input electrodes connected via resistance means to a variable resistance voltage divider network for controlling the output current of said valves, an intermediate current amplifying stage connected in cascade with said input stage, said intermediate stage including a pair of valves having their output electrodes connected via resistance means to a point of reference potential and their control electrodes connected to the respective output electrodes of said pair of valves in said input stage, a full wave bridge circuit connected to the output of said intermediate stage for driving a load directly connected thereto, said bridge circuit including a first pair of valves each having its control electrode connected respectively to the output electrodes of said pair of valves in said intermediate stage and a second pair of valves having their control electrodes coupled to said resistance means joining the output electrodes of said pair of valves in said intermediate stage to a point of reference potential, and said load being connected between the junctions of the output electrodes of one of each of said first and second pair of valves respectively in said bridge circuit.

2. The circuit of claim 1 wherein said valves in said input stage are transistors having their respective emitters connected to said voltage divider network via balanced resistor means, said voltage divider network having a first resistive branch thereof connected between said balanced resistor means and said point of reference potential and a second and third parallel connected variable resistance branches connected between said balanced resistance means and a power supply.

3. The circuit of claim 1 wherein said first and second pairs of valves in said full wave bridge circuit are opposite conductivity type transistors, one of each of said first and second pair of transistors having their emitters connected together said first pair of transistors having the collectors thereof connected to a power supply and the collectors of said second pair of transistors being connected to a point of reference potential.

4. The circuit of claim 1 wherein said valves in said intermediate stage include a pair of transistors each having a pair of series connected resistors connected between the collectors thereof and a point of reference potential, a first one of said pair of series connected resistors being connected between the bases of opposite conductivity type transistors in said first and second pairs of transistors in said full wave bridge circuit in order to bias all transistors in said bridge circuit into slight conduction in the absence of an input signal, feedback means connected between the junctions of the output electrodes of one of each of said first and second pairs of transistors in said bridge circuit and the respective output electrodes of said pair of transistors in said input driving stage.

5. The circuit of claim 1 wherein said valves in said input stage are transistors having their emitters connected to said voltage divider network via balance resistance means, said voltage divider network having a first resistive branch thereof connected between said balanced resistance means and a point of reference potential and a second and third parallel connected variable resistance branches connected between said balanced resistance means and a power supply, said first and second pairs of valves in said full wave bridge circuit being opposite conductivity transistors with one of each of said first and second pair of transistors having their emitters connected together, said first pair of transistors having their collectors connected to a power supply, and the collectors of said second pair of transistors being connected to a point of reference potential.

6. The circuit of claim 5 wherein said valves in said intermediate stage include a pair of transistors each having a pair of series connected resistors connected between their collectors and a point of reference potential, a first one of said pair of series connected resistors being connected between the bases of opposite conductivity transistors in said first and second pair of transistors in said full wave bridge circuit in order to bias one type conductivity transistors cutoff when the other type of conductivity transistor is conducting during the application of an input signal, and feedback means connected between the junction of the output electrodes of one of each said first and second pair of transistors in said bridge circuit and the respective output electrodes of said pair of transistors in said input driving stage.

7. A transformerless transistorized power amplifier circuit comprising a full wave transistor bridge circuit including a first pair of opposite conductivity type transistors having their emitters connected together, a second pair of opposite conductivity type transistors having their emitters connected together, one transistor in each of said first and second pair and of like conductivity being connected to a point of reference potential and the remaining transistor in each pair having its collector connected to a power supply, a pair of push-pull cascaded transistorized input stages adapted to receive an input push-pull signal, the first stage of said pair of cascaded stages having a voltage divider network connected between similar electrodes in each transistor thereof for providing balanced conduction in each transistor of said pair, the second stage of said pair of cascaded stages having a pair of similar electrodes in each transistor thereof connected via resistance means to a point of reference potential and said first and second pair of transistors in said full wave bridge circuit each having one transistor therein connected to said similar electrodes respectively in said transistors in the second stage and the other transistor in each of said pair of transistors in said full wave bridge circuit connected to said resistance means in said second stage whereby the bias developed across said resistance means is sufficient to maintain one transistor in each pair cutoff during alternate portions of the cycle of the input driving signal.

8. The circuit of claim 7 wherein load resistance means are connected between the emitters in said first and second pair of transistors in said full wave bridge circuit and feedback means connected between said emitters in said first and second pair of transistors in said full wave bridge circuit and each respective transistor of said pair of transistors in said first cascaded push-pull transistor stage.

9. The circuit of claim 8 wherein said emitters of said pair of transistors in said first cascaded stage are connected via balance resistance means to a voltage divider, said voltage divider having a first resistive branch thereof connected between said balance resistance means and a point of reference potential and a second and third parallel connected variable impedance branches connected between said balance resistance and a power supply, each one of said pair of transistors in said second cascaded stage having a pair of series connected resistors connected between its collector and a point of reference potential, a first one of said pair of series connected resistors being connected between the bases of the respective transistors in each pair of transistors in said full wave bridge circuit in order to bias one of said transistors in each pair to cutoff when the other transistor in each pair is conducting during the application of an input signal.

References Cited

UNITED STATES PATENTS 3,255,418 6/1966 Dufendach et al. ----- 330—13

ROY LAKE, *Primary Examiner.*

E. C. FOLSOM, *Assistant Examiner.*